(12) United States Patent  (10) Patent No.: US 8,368,044 B2
Tio Castro et al.  (45) Date of Patent: Feb. 5, 2013

(54) ELECTRONIC DEVICE COMPRISING A CONVERTIBLE STRUCTURE

(75) Inventors: David Tio Castro, Heverlee (BE); Romain Delhougne, Muizen (BE)

(73) Assignee: NXP B.V., Eindhoven (NL)

( * ) Notice: Subject to any disclaimer, the term of this patent is extended or adjusted under 35 U.S.C. 154(b) by 74 days.

(21) Appl. No.: 12/594,779

(22) PCT Filed: Apr. 17, 2008

(86) PCT No.: PCT/IB2008/051477
§ 371 (c)(1), (2), (4) Date: Oct. 5, 2009

(87) PCT Pub. No.: WO2008/129477
PCT Pub. Date: Oct. 30, 2008

(65) Prior Publication Data
US 2010/0295010 A1  Nov. 25, 2010

(30) Foreign Application Priority Data
Apr. 20, 2007 (EP) .................................. 07106577

(51) Int. Cl.
*H01L 29/02* (2006.01)
(52) U.S. Cl. ......... 257/2; 257/3; 257/4; 257/5; 257/529; 257/536; 257/E21.661; 257/E23.149; 438/382
(58) Field of Classification Search ................. 257/2, 3, 257/4, 5, 529, 536, E21.661, E23.149; 438/382
See application file for complete search history.

(56) References Cited

U.S. PATENT DOCUMENTS

| | | | |
|---|---|---|---|
| 6,800,563 B2 | 10/2004 | Xu | |
| 2004/0258866 A1 | 12/2004 | Shiba et al. | |
| 2005/0161747 A1 | 7/2005 | Lung | |
| 2005/0167645 A1 | 8/2005 | Kim et al. | |
| 2007/0046421 A1 | 3/2007 | Gogineni et al. | |
| 2007/0147104 A1* | 6/2007 | Kato et al. ............ | 365/145 |

FOREIGN PATENT DOCUMENTS

| | | |
|---|---|---|
| CN | 1573844 A | 2/2005 |
| CN | 1722488 A | 1/2006 |

OTHER PUBLICATIONS

International Preliminary Report on Patentability, International Bureau, Oct. 20, 2009.

* cited by examiner

*Primary Examiner* — Andy Huynh

(57) ABSTRACT

An electronic device (100), comprises a first electrode (101), a second electrode (102) and a convertible structure (103) connected between the first electrode (101) and the second electrode (102), which convertible structure (103) is convertible between at least two states by heating, wherein the convertible structure (103) has different electrical properties in different ones of the at least two states, wherein the convertible structure (103) is curved in a manner to increase a length of a path of an electric current propagating through the convertible structure (103) between the first electrode (101) and the second electrode (102).

24 Claims, 4 Drawing Sheets

ELECTRONIC DEVICE COMPRISING A CONVERTIBLE STRUCTURE

FIELD OF THE INVENTION

The invention relates to an electronic device.
Moreover, the invention relates to a method of manufacturing an electronic device.

BACKGROUND OF THE INVENTION

In the field of non-volatile memories, flash memory scaling beyond a 45 nm node has become a real issue. Technologies to face this challenge are ferroelectric, magnetic and phase change memories, the latter one being promising for the replacement of flash and showing characteristic that may allow replacement of other types of memories such as DRAM. Phase change memories are a possible solution for the unified memory being an important step in the electronics art. OTP ("on time programmable") and MTP ("multiple times programmable") memories open a field that may present a great opportunity for phase change memories as well.

Phase change memories are based on a reversible memory switching using, for instance, chalcogenide materials. The ability of these materials to undergo fast phase transition has led to the development of rewritable optical media (CD, DVD). The chalcogenide phase change materials may be divided in two classes that are slightly different compositions, based on their crystallization mechanism. The "nucleation dominated" material GeTe—$Sb_2Te_3$ tie line such as $Ge_2Sb_2Te_5$ are generally used in ovonic unified memory (OUM) devices. In this concept, the phase change material may be in contact with a bottom-resistive electrode to switch reversibly to a small volume of phase change material. "Fast growth material", known in optical storage application (CD-RW/DVD+RW), enable very fast switching (for instance 10 ns) with a proper phase stability. In such an approach, the active part of a memory device may be a phase change line formed in between two electrodes formed in the back end of line processing (BEOL) of a CMOS-based front end of line (FEOL).

Thus, phase change materials may be used to store information. The operational principle of these materials is a change of phase. In a crystalline phase, the material structure is, and so properties are, different from the properties in the amorphous phase.

The programming of a phase change material is based on the difference between the resistivity of the material and its amorphous and crystalline phase. To switch between both phases, an increase of the temperature is required. Comparatively high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the memory cell. A high current density caused by the pulse may lead to a local temperature increase. Depending on the duration and amplitude of the pulse, the resulting phase will be different. A fast cooling and large amplitude may quench the cell in an amorphous phase, whereas a slow cooling down and a smaller amplitude pulse may allow the material to crystallize. Larger pulse amplitudes, so-called RESET pulses, may amorphize the cells, whereas smaller pulse amplitudes will SET the cell to its crystalline state, these pulses are also called SET pulses.

U.S. Pat. No. 6,800,563 discloses a phase-change memory having a tapered lower electrode coated with an insulator. The coated, tapered electrode acts as a mask for a self-aligned trench etch to electrically separate adjacent wordlines. The tapered lower electrode may be formed over a plurality of doped regions, and isotropic etching may be used to taper the electrode as well as part of the underlying doped regions. The tapered shape of the lower electrode shall reduce the contact area between the electrode and a phase-change material. This shall increase the resistance at the point of contact, increasing the ability of the electrode to heat the layer.

However, programming the memory cell according to U.S. Pat. No. 6,800,563 may require high power consumption.

OBJECT AND SUMMARY OF THE INVENTION

It is an object of the invention to provide an electronic component having a convertible structure that can be programmed with reasonable power consumption.

In order to achieve the object defined above, an electronic device and a method of manufacturing an electronic device according to the independent claims are provided.

According to an exemplary embodiment of the invention, an electronic device is provided comprising a first electrode, a second electrode, and a convertible structure connected between the first electrode and the second electrode, wherein the convertible structure is convertible between at least two states by heating, wherein the convertible structure has different electrical properties in different ones of the at least two states, and wherein the convertible structure is curved (for instance bended and/or angled) specifically in a manner to increase a length of a path of an electric current propagating through the convertible structure between the first electrode and the second electrode.

According to another exemplary embodiment of the invention, a method of manufacturing an electronic device is provided, the method comprising forming a first electrode, forming a second electrode, connecting a convertible structure between the first electrode and the second electrode, which convertible structure is convertible between at least two states by heating, wherein the convertible structure has different electrical properties in different ones of the at least two states, and curving the convertible structure (or providing a curved convertible structure) in a manner to increase a length of a path of an electric current propagating through the convertible structure between the first electrode and the second electrode.

The term "electronic component" may particularly denote any component, member or apparatus, which fulfils any electric, magnetic and/or electronic functionality. This means that electric, magnetic and/or electromagnetic signals may be applied to and/or generated by the electronic device during regular use.

The term "convertible structure" may particularly denote any physical structure having convertible properties. Examples are a phase change structure or a structure with thermo-dependent properties. Phase change materials can have not only two phases but also more than two phases, for instance crystalline, amorphous, meta-amorphous, meta-crystalline, crystalline with a different lattice orientation, etc.

The term "phase change structure" may particularly denote any physical structure that has the property to change any physical parameter or material property under the influence of heat (generated by ohmic losses of an electric current flowing through the phase change structure or an electrically/a thermally coupled heating element, and/or generated by the absorption of electromagnetic radiation). This may particularly mean a switch of a material such as a chalcogenide between an amorphous configuration and a crystalline configuration, which may be accompanied by a significant change in the electrical resistivity. However, any other phase changes such as a change from a solid to a liquid phase, which phase changes are connected with a change of a physical property, may be covered by this term.

The term "memory cell" may particularly denote a physical structure (such as a layer sequence, for instance monolithically integrated in a substrate such as a silicon substrate) which allows to store information in an electronic manner. An amount of information stored in a memory cell may be 1 bit (particularly when the phase change material is switched between two phases representing logical values "1" or "0") or may be more than 1 bit (particularly when the phase change material is switched between at least three phases). The memory cell may be formed on and/or in a substrate which may denote any suitable material, such as a semiconductor, glass, plastic, etc.

The term "substrate" may be used to define generally the elements for layers that underlie and/or overlie a layer or portions of interest. Also, the substrate may be any other base on which a layer is formed, for example a semiconductor wafer such as a silicon wafer or silicon chip.

The term "curved" convertible structure may particularly denote that the convertible structure has a geometrical extension which is not linear or which is non-straight in a region between the two electrodes. Examples are: bended, angled, and oscillation geometries. However, a property of the curvature may be that the length of an electric current path is intentionally increased between the two electrodes as a result of the curvature. In other way, the curvature may prevent a linear current flow path between the electrodes. An electric current may have the tendency to search for the shortest path between two electrodes. This path may be denoted as the path of the electric current propagating through the convertible structure. By curving the convertible structure relative to a direct connection line between the two electrodes, the effective current path may be made longer, thereby allowing for a reduced demand for power for altering a phase change of a phase change material between a crystalline state and an amorphous state.

The term "propagation" may denote a current flow, that is to say a flow of charge carriers carrying the electric current through the convertible material.

According to an exemplary embodiment of the invention, a bended phase change line cell is provided, in which a propagation path of a current applied between two electrodes to the convertible structure is efficiently increased compared to a linear geometry, thereby relaxing the power demand for programming such a convertible material, particularly in case of a phase change material. A reason for reduced power requirements resulting from such a curved geometry may be that the increased length increases also the ohmic resistance, which may efficiently supply the phase change material with heat or thermal energy needed for a phase change. More particularly, a longer line increases the distance from the hot spot during programming (typically located around the center of the line) and the electrodes on the edges. Being those electrodes the main heat drain, the heat efficiency may be improved. Consequently, after some 'maximum' length, it is possible that any further increase in length does not further improve the power efficiency. Increasing the resistance may be beneficial for coupling to the access transistor, and then for scalability.

Phase change materials conventionally require a high temperature to switch from the amorphous to the crystalline state, or vice versa. In silicon memories, Joule heating may do this so that an electrical current may cause the material to warm respectively heat up. In order to reduce power consumption, the line length of a phase change cell can be increased. Nevertheless, increasing length goes in the opposite direction of reducing sizes to scale the concept for smaller nodes. According to an exemplary embodiment of the invention, in order to increase the length of the line to reduce the power without compromising the integration, it is possible to laterally curve a line cell between electric terminals to get a longer line without increasing the straight distance between edges. According to another embodiment, curving a trench or defining a certain topography may be possible so that the phase change line cell can be patterned on this topography, with the same resulting effect, namely that the total line length is increased while the distance between electrodes is kept the same. Consequently, power consumption and scalability may be improved.

By bending respectively folding a phase change material strip (within two dimensions or using a 3D topography), it is possible to increase the resistance and to simultaneously keep the area of a cell small. Using electrodes also as heat elements, a proper confinement of the heat in a center of the line may be possible. The electrodes may serve as current sources, but thermally talking they may act as a drain since they may take the heat out of the cell.

According to an exemplary embodiment of the invention, a phase change cell line is provided in which the phase change line is formed on top of a non-planar surface to increase the length of the cell. According to another exemplary embodiment, a phase change cell is provided in which the phase change line is formed on top of a planar surface and the design is curled/bended/turned/folded between electrodes in order to increase the effective length of the cell. These embodiments may also be combined for any material, in which the purpose of generating more or more efficient heating due to a longer line dimension while keeping the straight distance between the electrodes small or minimal is maintained.

Exemplary embodiments of the invention may particularly be applied in the context of any device in which the shape plays an important role, especially when line length requires to be increased keeping the distance between the edges. Therefore, it is possible to apply such a concept to phase change memories, but also to other devices such as silicon fuses, OTP (one time programmable), MTP (multiple time programmable), BEOL (back end of the line) fuse technologies, etc.

Next, further exemplary embodiments of the electronic device will be explained. However, these embodiments also apply to the method of manufacturing an electronic device.

The convertible structure may form a thermo-dependent structure, particularly a phase change structure that is convertible between at least two phase-states. Thus, under the influence of heat which may be generated by ohmic losses of a programming current flowing through the phase change structure and/or electrodes connected thereto, the switch between the two phases can be initiated. Thermal energy may also be supplied via electromagnetic radiation. However, thermal energy can be also supplied by a contiguous structure/heater.

Particularly, the phase change structure may be adapted such that a value of the electrical conductivity differs between the two phase-states. In one of the at least two phase states, the phase change structure may be electrically conductive (for instance essentially metallically conductive). In the other phase state, the electrical conductivity may be larger or lower than in the first state, for instance the phase change structure may be superconductive or may be semiconductive or may be isolating or may be conductive as well with a modified value of conductivity. In a normal operation of the electronic component, the function of the electronic device will be influenced, will be defined or will depend on the present value of the electrical conductivity of the phase change structure. This may allow manufacturing memory cells, switches, actuators, sensors, etc. using the different value of the electrical conductivity of the phase change structure in the different phase modes.

A current pulse or a current signal may generate heat generated in a convertible material to thereby change its phase state and consequently its value of the electrical conductivity. The applied current pulses may have a certain shape (for instance may have a fast raising edge and a slow falling edge, or may have a raising edge which is curved to the right and a falling edge which is curved to the left) and may be characterized by different parameters (such as current amplitude, pulse duration, etc.). By adjusting the pulse parameters, it is possible to control whether the phase change material is converted into a crystalline phase or is converted into an amorphous phase. Very high temperatures with rapid cooling down may result in an amorphous phase. A smaller increase in temperature or slower cooling down may lead to a crystalline phase.

The phase change structure may be adapted such that one of the two phase-states relates to a crystalline phase and the other one of the two phase-states relates to an amorphous phase of the phase change structure. Such a material property can be found in chalcogenide materials. A chalcogenide glass may be used which is a glass containing a chalcogenide element (sulphur, selenium or tellurium) as a substantial constituent. Examples for phase change materials are GeSbTe, AgInSbTe, InSe, SbSe, SbTe, InSbSe, InSbTe, GeSbSe, GeSbTeSe or AgInSbSeTe.

The electronic component may comprise an electric sensing circuitry adapted for sensing the different electrical properties of the convertible structure in different ones of the at least two states. For instance, a test voltage may be applied to the convertible structure, and a current flowing along the convertible structure will depend on the phase state of the convertible structure, since the electrical conductivity is different in the crystalline and in the amorphous phase. Such a sensing circuitry may also include selection transistors or other kinds of switches which selectively enable or disable access to a particular electronic component of an array of electronic components. Thus, a respective selection transistor may be assigned to each one of the electronic components.

The electronic device may comprise a substrate. Such a substrate may be, for instance, a semiconductor substrate such as a silicon wafer or chip. The convertible structure may be monolithically integrated in the substrate or may be provided on the substrate. Such a substrate usually has a planar main surface. The curvature of the convertible structure may then be provided within such a surface plane, that is collinear with such a surface plane. In other words, a two-dimensional planar area on the top of the substrate may be used for depositing material of the convertible structure. Such a deposited layer can be etched to generate any desired curvature so as to extend the length of the current path along which an electric current travels through the convertible structure. Such a curved geometry may include a meander shape, a spiral shape, a zigzag shape, a saw tooth shape, an arcuate shape, or any combination of at least two of these or other shapes.

Additionally or alternatively, the convertible structure may also be curved out of a surface plane of the substrate, for instance with portions of the convertible structure enclosing an angle being different from zero with a surface of the substrate. This may result in a slanted or perpendicular alignment between the current path and the surface of the substrate. Particularly, the curvature may have contributions in a direction perpendicular to the main surface of the substrate.

Again, in a direction that is out of/apart from/different from the main surface of the substrate, the curvature of the convertible structure may have a meander shape, a zigzag shape, a saw tooth shape, or a combination of at least two of these or other shapes.

Particularly, the convertible structure may line or cover at least a part of a wall of a trench formed in the substrate. When both the lateral walls and the bottom wall of a trench etched in the substrate is covered with a layer of the convertible material, the current flowing through the convertible structure (when surrounded by electrically insulating material) has to flow through the entire trench, thereby travelling a long way which intentionally increases the resistivity and the ohmic losses and relaxes the conditions for the power for programming such a convertible structure. This may also (depending on the shape of the trench and electrodes) increase the distance between the programming point and the electrodes.

A cross-section of such a trench may have a rectangular shape, may have a U-shape, or may even have an essentially triangular shape. By selectively adjusting the shape of such a trench, it is possible to accurately define the programming power without an increase of the size of the electronic device.

The above-mentioned switch may be arranged on and/or in the substrate above or below the convertible structure and between the first electrode and the second electrode. By taking this measure, a vertical stack of switch and convertible structure may be provided which allows for a space-efficient manufacture of the electronic device, thereby allowing for a large integration density.

As an alternative or in addition to the trench configuration, it is also possible to arrange the convertible structure on at least a part of the surface of an elevation structure (such as a bump) formed (for instance using deposition and/or etching techniques) on the substrate. A specifically large extension of the current propagation path can be obtained by combining both, trenches and elevation structures. Also an elevation structure may have an essentially rectangular shape, an essentially triangular shape, a U-shape, etc.

The electronic device may be adapted as a memory device. In such a memory device, the information of one or more bits may be stored in the present phase of the phase change material, particularly depending on the present one of two or more phase states of the phase change structure.

The electronic device may also be adapted as a memory array, that is a configuration of a (large) plurality of memory devices of the aforementioned type. In such a memory array, the memory cells may be arranged in a matrix-like manner and may be controlled via bit lines and word lines with transistors serving as switches to get or prevent access to desired individual memory cells and memory devices. The multiple memory cells may be monolithically integrated in a common (for instance silicon) substrate.

The electronic component may also serve as an actuator, since a change of the electrical conductivity of the phase change structure may result in a modification of an actuation signal.

It is also possible to adapt the electronic component as a microelectromechanical structure (MEMS). An electrical signal modified by a phase change of the convertible material may result in a specific motion of a movable component of the microelectromechanical structure (MEMS).

It is clear that the modification of the phase change material, and therefore of its electrical conductivity, may be used to construct controllers, switches, transductors, etc.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, and BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
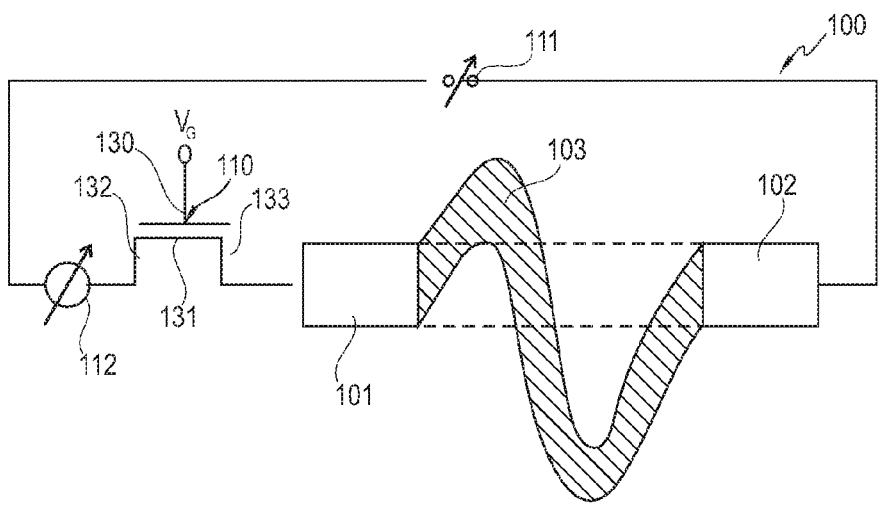
FIG. 1 illustrates an electronic memory cell device according to an exemplary embodiment of the invention.

The illustration in the drawing is schematical. In different drawings, similar or identical elements are provided with the same reference signs.

In the following, referring to FIG. 1, a phase change material memory cell 100 according to an exemplary embodiment of the invention will be explained.

The memory cell 100 comprises a first electrode 101 and comprises a second electrode 102. Between the first electrode 101 and the second electrode 102, and electrically coupled thereto, a sinusoidal bended phase change material structure 103 is provided which can be converted between a crystalline state and an amorphous state by Joule heating by applying an appropriately high current between the electrodes 101 and 102. In the crystalline state and in the amorphous state, the phase change material structure 103 has different values of conductivity.

As can be taken from the schematic drawing in FIG. 1, the phase change material structure 103 is curved in a sinusoidal manner to effectively increase a length of a path of an electric current propagating from the first electrode 101 through the convertible structure 103 to the second electrode 102, or in an opposite direction. The geometric (physical) curvature of the phase change material structure 103 particularly increases the length of the electronic current path as compared to a case which is indicated schematically in broken lines in FIG. 1, representing a scenario in which the arrangement of the convertible structure 103 between the two electrodes 101, 102 is straight or linear, that is to say connects the two electrodes 101, 102 along the shortest path. In contrast to this, the curved phase change material structure 103 artificially and selectively increases the length of an electric signal travelling between the two electrodes 101, 102 through the convertible structure 103. This may allow to increase the effective ohmic resistance and to reduce the power amount needed to convert the phase change material 103 from the crystalline phase into the amorphous phase, or vice versa.

Furthermore, a selection transistor 110 is provided (alternatively, a diode may be employed). A gate voltage $V_G$ can be applied to a gate region 130 of the access transistor 110 so that the channel region 131 between two source/drain connections 132, 133 becomes electrically conductive. In such an electrically conductive state of the switch transistor 110, a current or voltage source 111 (providing a controllable electric voltage) can apply a voltage signal flowing between the two electrodes 101, 102 through the phase change material structure 103. However, this can be done the other way around, for instance applying a pulse to a source/drain terminal 132, 133 and after that opening the gate 130 through a voltage applied to the gate 130. Depending on the present state of the phase change material structure 103 (crystalline or amorphous), a value of the flowing current as detected by a current detector 112 may be larger or smaller. Thus, by taking such a measure, it is possible to sense the stored information in the memory cell 100, which is encoded in the conductivity value of the phase change material structure 103.

For programming the phase change material structure 103, the controllable voltage source 111 may, in an operation state in which the switch transistor 110 is conductive, apply an appropriate current pulse pattern so as to selectively bring the phase change material structure 103 into the crystalline or the amorphous state.

Figure 2:
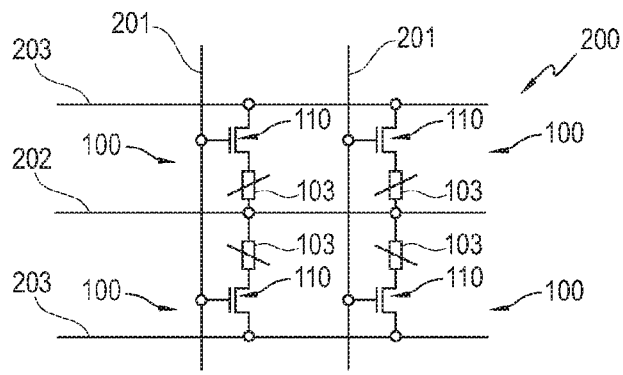
FIG. 2 illustrates a phase change memory array according to an exemplary embodiment of the invention.

FIG. 2 illustrates a memory array 200 according to an exemplary embodiment of the invention.

In the memory array 200, the individual memory cells 100 are shown in a matrix-like arrangement. Via individual ones of word lines 201, switch transistors 110 of a column of memory cells 100 may be activated. Then, a current flowing between a ground line 202 and a corresponding bit line 203 may be sensed, to read out information from a corresponding memory cell 100.

In a memory array further nodes may usually require smaller CMOS transistors 110. These transistors 110 may be used as access devices of a memory cell. In case of a phase change memory cell as the phase change memory cell 100, the transistors 110 are situated in series with a phase change cell 103.

Figure 3:
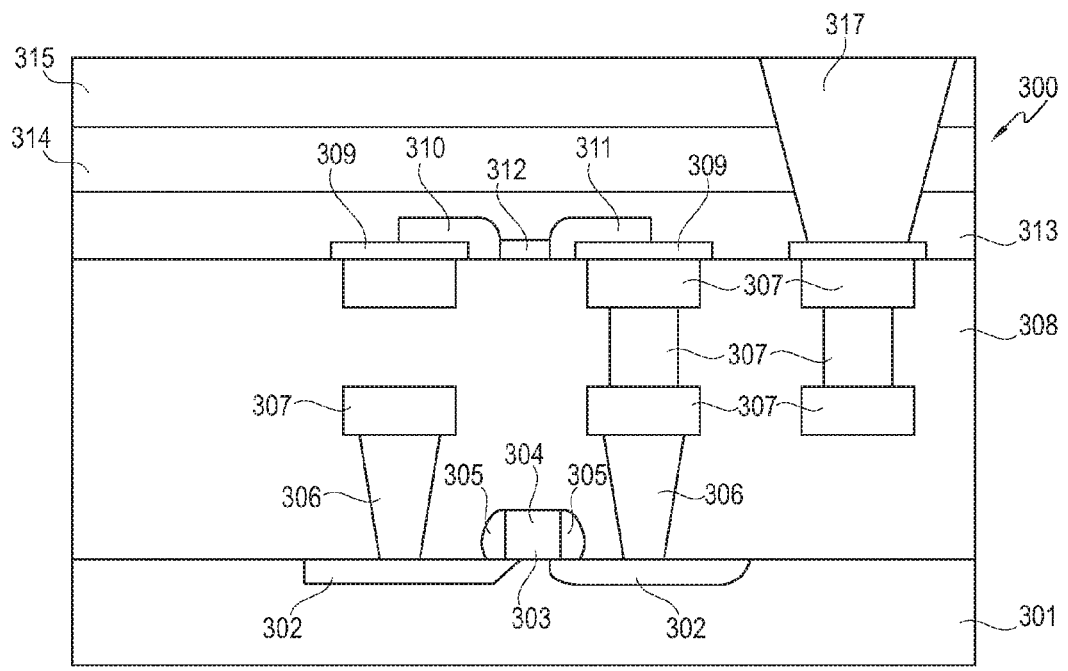
FIG. 3 shows a cross-section of a conventional integrated phase change line cell.

The integration scheme of a conventional phase change memory 300 is illustrated in FIG. 3 from a lateral cross-section.

The conventional memory cell 300 comprises a substrate 301, first and second source/drain regions 302 formed in the substrate 301, a gate insulating layer 303, a control gate 304, lateral side wall spacers 305, tungsten vias 306 connecting the transistor with metallization structures 307 and embedded in a silicon oxide layer 308. Furthermore, TaN structures 309 (electrodes) are formed as well as first and second phase change structures 310, 311. Between the first and second phase change structures 310, 311, a third phase change structure 312 is provided, and is embedded in a low temperature dielectric layer 313. Furthermore, a silicon oxide layer 314 and a silicon nitride layer 315 are provided. An AlCu contact 317 is provided as well.

Transistor bias currents scale with the same factors than device dimensions. This factor may be denoted as a scale factor, s. The power required to program a phase change cell to its RESET state is equal to the power needed to $P_{reset}=R_{cell}I_{reset}^2$, where $P_{reset}$ is the power needed to reset a cell, $R_{cell}$ is the resistance of the phase change cell, and $I_{reset}$ is the current needed to reset the phase change line.

Since the maximum current provided by a series transistor scales with s, the maximum generated power will scale with $s^2$. This means that, for future nodes, the available programming power will be scaled with $s^2$. This is a very aggressive scaling. When taking s=0.7 as an example, $s^2$=0.49, which means that the programming power would have to half in every generation. Power decrease is an issue for this technology.

In order to fit the CMOS scalability, two alternatives are valid regarding the above equation:
  increasing $R_{cell}$ of the cell with a factor of s will scale the power in the above equation only with s.
  reducing $P_{reset}$, the required reset power to the program cell. New materials or cell designs to increase power efficiency may have to reduce the power required to program the cell, enabling a larger scalability of the RESET power.

In order to reduce the programming power of a phase change cell, the number of squares of said cell plays an important role. The number of squares describes the aspect ratio of a cell. One square can be defined as a portion of a line with the same length as the line width. A line with more squares may lead to a reduction in the programming power mainly due to the better heat confinement and then, improved efficiency. On the same way, a line with more squares will have a larger resistance contributing to maintain the balance in the above equation.

Figure 4:
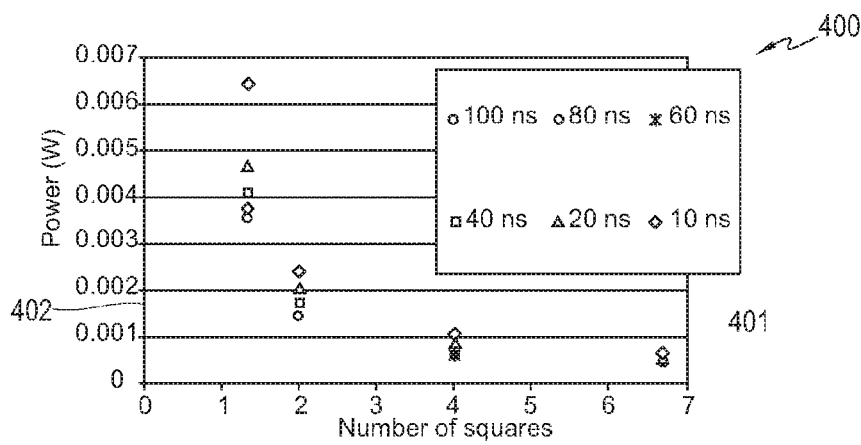
FIG. 4 shows a diagram illustrating a power reduction versus a number of squares for a memory device.

FIG. 4 shows a diagram 400 having an abscissa 401 along which a number of squares is plotted. Along an ordinate 402, the power is plotted in Watt. Thus, FIG. 4 shows a power reduction versus a number of squares characteristic, for different pulse widths.

One way of increasing the number of squares of a cell is reducing the width while the length is kept constant.

Figure 5:
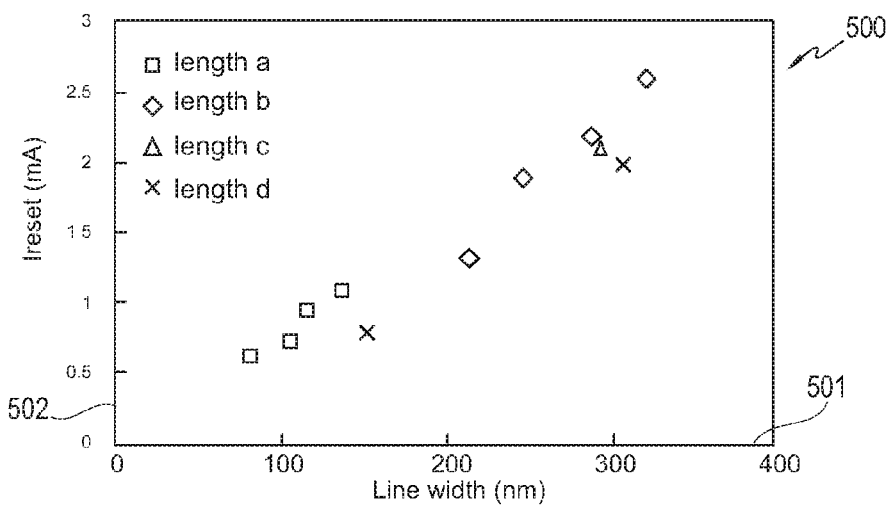
FIG. 5 is a diagram illustrating the dependence of a reset current from a line width of a phase change line cell.

FIG. 5 shows a diagram 500 having an abscissa 501 along which the width of a cell is plotted in nm. Along an ordinate 502, a current is plotted in milliampere.

FIG. 5 shows data for four different values of the length of the cell.

Thus, FIG. 5 shows that in order to reduce the programming current, it is necessary to reduce the dimensions of the phase change line. This reduction in width appears to be very critical and difficult to achieve due to the extreme sensitivity of the phase change material against the dry etch chemistry which may be used during the patterning.

An alternative solution is to increase the number of squares to increase the length of the line. Nevertheless, the distance between TaN electrodes depicted in FIG. 3 should comply with the design rules, therefore distance between them is restricted.

Exemplary embodiments of the invention allow to increase the length of the phase change cell without increasing the distance between electrodes. According to an exemplary embodiment of the invention, it is possible to increase the number of squares of a line cell without increasing the distance between the two electrodes.

Particularly taking one or both of the following two measures can do this increase of a line length:
  By depositing and subsequently patterning a line cell over a non-planar area of a substrate. The effective length of the phase change line is thereby increased (see FIG. 6 to FIG. 9).
  By designing a curved (for instance meander) line instead of a straight line (see FIG. 10) on a planar surface of a substrate.

Figure 6:
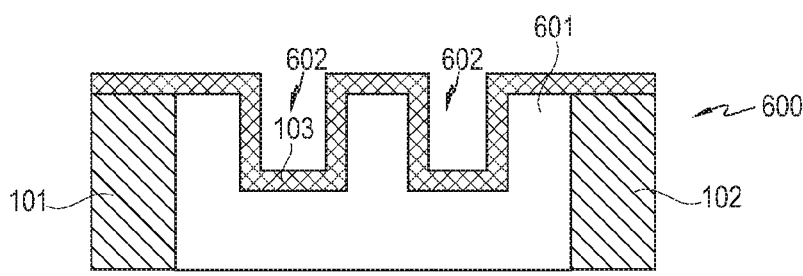
FIG. 6 to FIG. 10 show electronic devices according to exemplary embodiments of the invention.

FIG. 6 shows a memory cell 600 according to an exemplary embodiment of the invention in which trenches 602 are etched in an electrically insulating layer 601.

Then, a phase change line layer 103 is deposited to cover the walls of the trenches 602, thereby extending the effective length of the phase change material. FIG. 6 shows a cross-section of such a multi-trench topography for the phase change line cell 600.

Figure 7:
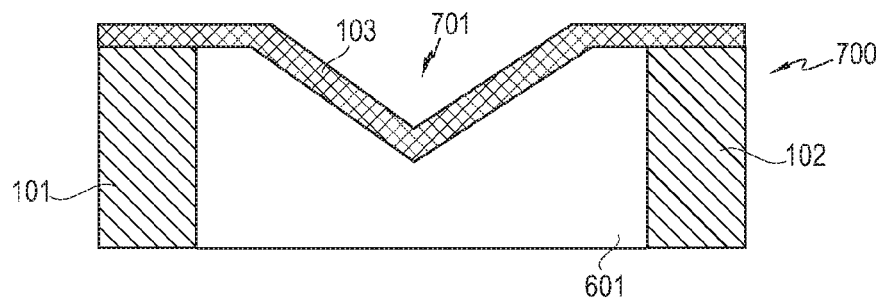

In FIG. 7, a single triangular (or V-shaped) trench 701 is formed in an electrically insulating layer 601 for manufacturing a memory cell 700 according to another exemplary embodiment of the invention.

In this case, a phase change layer 103 is deposited on top of the patterned structure, thereby extending the effective length of the current path due to the triangular geometry. FIG. 7 therefore shows a cross-section of a depression topography for a phase change line cell 700. The "triangle" may be formed by the two slanted line portions and by a horizontal line in FIG. 7. Or in other words, the V-shape may be realized by the two slanted line portions in FIG. 7.

Figure 8:
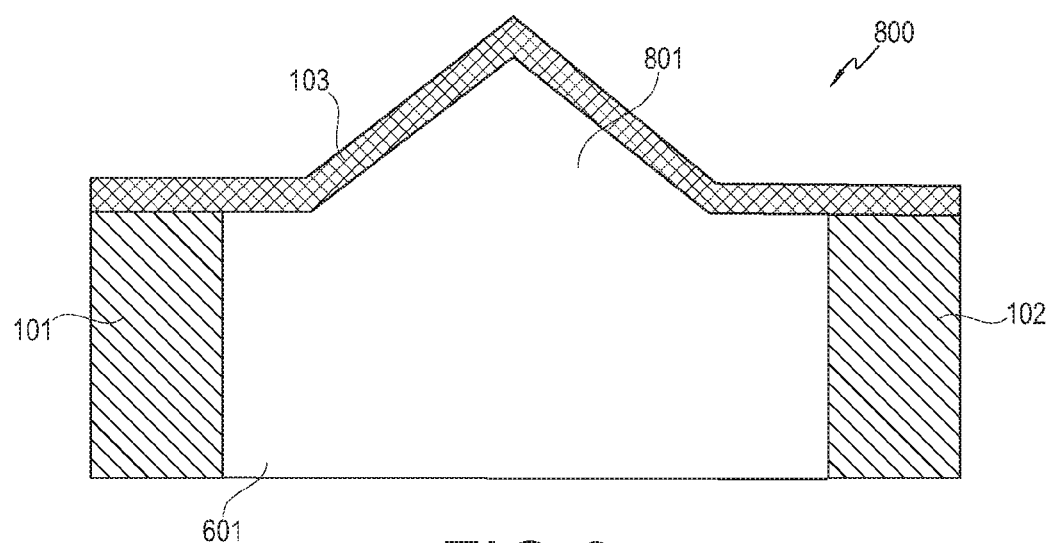

A phase change memory cell 800 according to an exemplary embodiment of the invention shown in FIG. 8 is obtained by generating a bump 801 on or in an electrically insulating layer 601. Consequently, a hill topography for a phase change line cell 800 is obtained.

Figure 9:
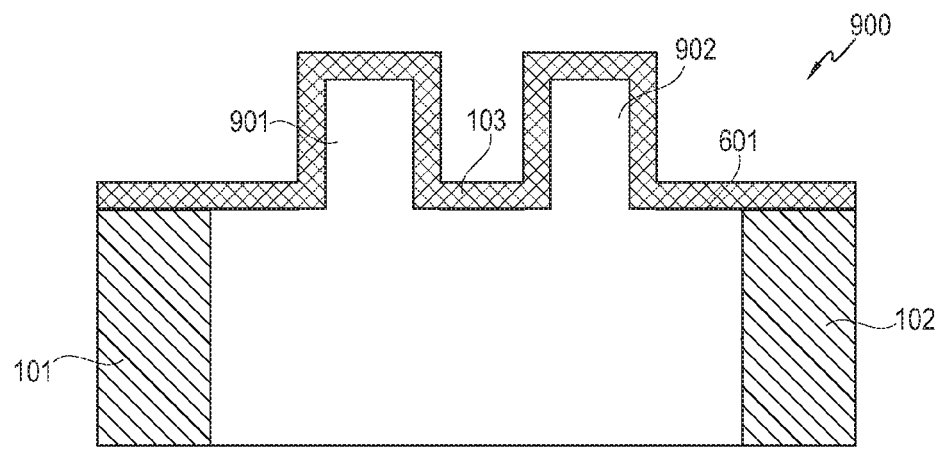

FIG. 9 shows a memory cell 900 according to another exemplary embodiment of the invention.

In this embodiment, a first rectangular elevation structure 901 and a second rectangular elevation structure 902 are generated on the surface of the substrate 601. Then, a layer of a phase change material 103 is deposited on the surface.

Therefore, a cross-section of battlement topography for the phase change line cell 900 is shown in FIG. 9.

Figure 10:
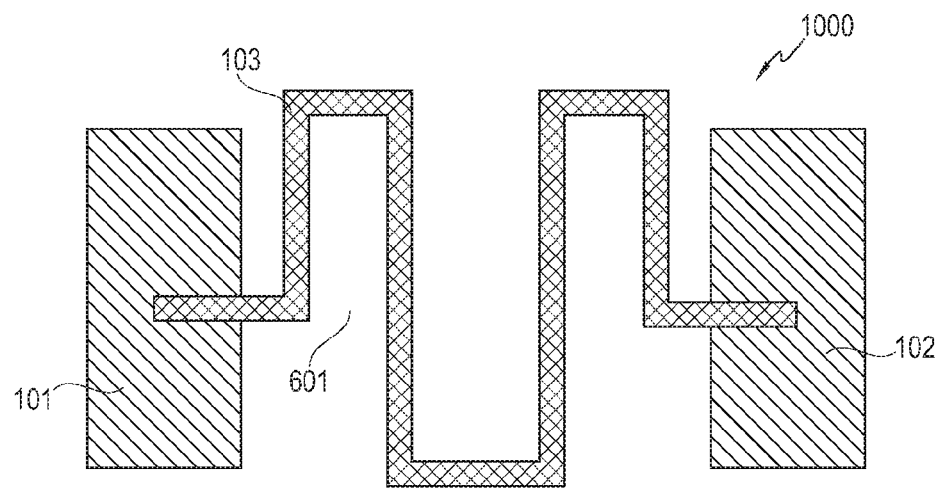

An alternative (or additional) way of increasing the effective length of the line is to bend it in a horizontal plane, making it curling or shaping it in such a way that the effective length is increased while a distance between electrodes 101, 102 is kept constant. Such an embodiment is shown in the memory cell 1000 of FIG. 10 according to another exemplary embodiment. A meander-shaped phase change material structure 103 is shown connecting the electrodes 101, 102 in a manner differing from a shortest geometric path, thereby artificially increasing the length of the current path between the first electrode 101 and the second electrode 102. FIG. 10 is a top view of the meander line cell 1000.

In the following, a procedure for building a trench phase change line according to another exemplary embodiment of the invention is given referring to FIG. 11 to FIG. 15. Each of FIG. 11 to FIG. 15 shows both, a top view (left-hand side of the sheet) and a cross-section of the corresponding layer sequences.

Figure 11:
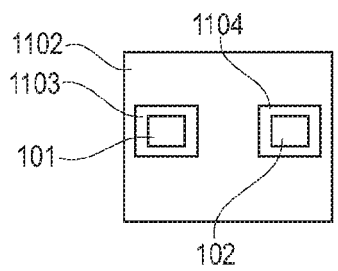
FIG. 11 to FIG. 15 show layer sequences obtained during manufacture of electronic devices according to exemplary embodiments of the invention.
Figure 11:
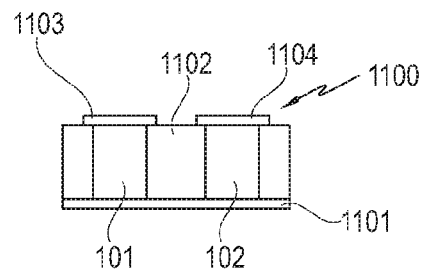

As can be taken from a layer sequence 1100 shown in FIG. 11, a dielectric substrate 1101 is provided, wherein metallic electrodes 101, 102 are formed in a further dielectric layer 1102 on the substrate 1101. These electrodes 101, 102 may be capped by a further metallic structure 1103, 1104.

Figure 12:
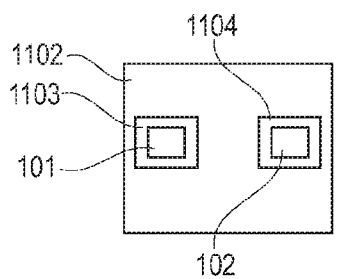
Figure 12:
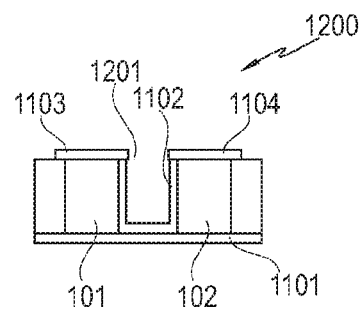

As can be taken from a layer sequence 1200 shown in FIG. 12, a trench 1201 is etched in the dielectric layer 1102, followed by subsequent photolithography and dry etching, selectively towards the metals 101, 102, 1103, 1104.

Figure 13:
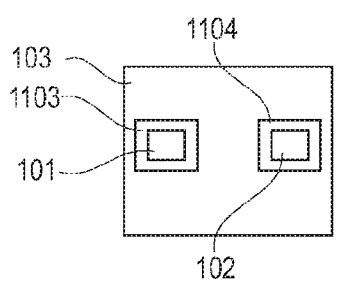
Figure 13:
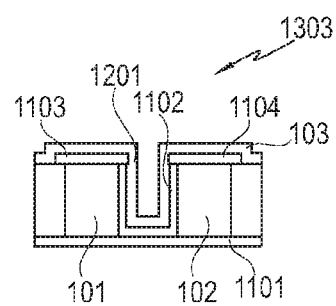

Then, as can be taken from a layer sequence 1300 shown in FIG. 13, phase change material 103 is sputtered and deposited over the entire surface of the wafer. Deposition parameters may be adjusted to ensure good step coverage.

Figure 14:
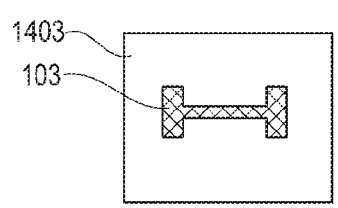
Figure 14:
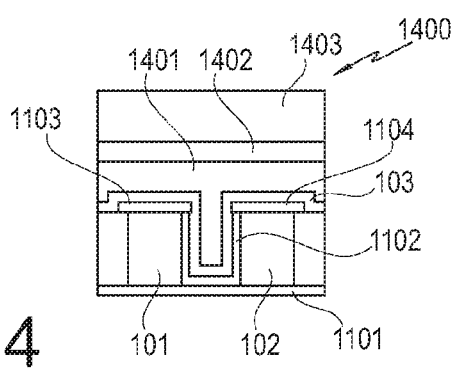
Figure 15:
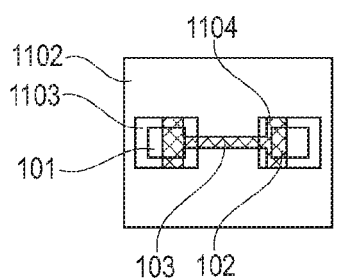
Figure 15:
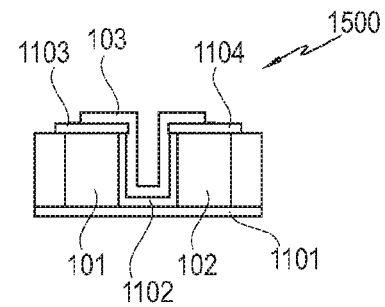

Due to the large topography over the wafer, a planarizing layer 1401 may deposited over the layer sequence 1300, as can be taken from a layer sequence 1400 shown in FIG. 14. Furthermore, a BARC (bottom antireflective coating) layer 1402 and a photoresist 1403 may be applied to the top of the surface.

A planarizing layer is deposited before exposing the wafer for patterning the phase change material (PCM) cell. Once the PCM line is patterned over this topography, a dry step process may remove all layers including the planarizing layer. The result can be seen as the layer sequence 1500 shown in FIG. 15. As a result of this process, the line length is effectively increased, due to the patterning over the trench.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. An electronic device, the electronic device comprising:
    a first electrode;
    a second electrode;
    a convertible structure connected between the first electrode and the second electrode, the convertible structure being convertible between at least two states by heating and having different electrical properties in different ones of the at least two states, the convertible structure having a length extending an entire distance between the first electrode and the second electrode, and the length having a uniform width extending the entire distance from the first electrode to the second electrode, and
    a portion of the convertible structure having an oscillating geometry with at least two rounded curvatures.

2. The electronic device according to claim 1, wherein the convertible structure is a thermo-dependent phase change structure, which is convertible between at least two phase states.

3. The electronic device according to claim 2, wherein the convertible structure is configured to convert between the at least two phase states in response to an amount of current passing between the first and second electrodes, the amount of current being dependent on the length of convertible structure, the length of the convertible structure being configured and arranged to reduce the amount of current relative to convertible structures having other lengths.

4. The electronic device according to claim 1, wherein the convertible structure is electrically conductive in at least one of the at least two states.

5. The electronic device according to claim 1, comprising an electric sensing circuit adapted for sensing the different electrical properties of the convertible structure in different ones of the at least two states.

6. The electronic device according to claim 1, wherein the convertible structure is adapted such that a value of the electrical conductivity differs between the at least two states.

7. The electronic device according to claim 1, wherein the convertible structure is adapted such that one of the at least two states relates to a crystalline phase and another one of the at least two states relates to an amorphous phase of the convertible structure.

8. The electronic device according to claim 1, comprising a switch, particularly one of the group consisting of a transistor, a field effect transistor, a bipolar transistor, a FinFet, and a diode, electrically coupled to the convertible structure.

9. The electronic device according to claim 8, wherein the switch is arranged on and/or in the supporting material, above or below the convertible structure and between the first electrode and the second electrode.

10. The electronic device according to claim 1, comprising a supporting material on and/or in which the convertible structure is formed.

11. The electronic device according to claim 10, wherein the convertible structure is curved within a plane being parallel to a surface plane of the supporting material.

12. The electronic device according to claim 10, wherein the supporting material and the convertible structure are in direct contact.

13. The electronic device according to claim 1, adapted as one of the group consisting of a memory device, a memory array, an actuator, a microelectromechanical structure, a controller, and a switch.

14. The electronic device according to claim 1, further including a heat sink, wherein the first and second electrodes are configured to dissipate heat from the convertible structure as part of the heat sink.

15. The electronic device according to claim 1, wherein the convertible structure is a programmable fuse element.

16. The electronic device according to claim 1, wherein the uniform width is sufficiently uniform to provide the different electrical properties across the entire length of the convertible structure in response to different electric currents respectively associated with the different electrical properties.

17. An electronic device-the electronic device comprising:
    a first electrode;
    a second electrode;
    a convertible structure formed on a supporting material and connected between the first electrode and the second electrode, the convertible structure being convertible between at least two states by heating and having different electrical properties in different ones of the at least two states, the convertible structure being curved out of a surface plane of the supporting material in a manner to increase a length of a path of an electric current propagating through the convertible structure between the first electrode and the second electrode relative to a shorted-distance path between the first and second electrodes, the convertible structure having a length and a uniform width that extend from the first electrode to the second electrode, the length having a first end directly connected to the first electrode and having a second end directly connected to the second electrode.

18. The electronic device according to claim 17, wherein the convertible structure has an oscillating geometry with at least two rounded curvatures.

19. The electronic device according to claim 17, wherein the convertible structure lines at least a part of a wall of a trench formed in the supporting material.

20. The electronic device according to claim 19, wherein a cross-section of the trench has one of the group consisting of a rectangular shape, a triangular shape, a U-shape, and a V-shape.

21. The electronic device according to claim 17, wherein the convertible structure is arranged on at least a part of a surface of an elevation structure formed on the supporting material.

22. The electronic device according to claim 21, wherein a cross-section of the elevation structure has one of the group consisting of a rectangular shape, a triangular shape, a U-shape, and a V-shape.

23. The electronic device according to claim 17, wherein the uniform width is sufficiently uniform to provide the different electrical properties across the entire length of the convertible structure in response to different values of the electric current respectively associated with the different electrical properties.

24. A method of manufacturing an electronic device, the method comprising forming a first electrode; forming a second electrode; connecting a convertible structure between the first electrode and the second electrode, which convertible structure has a uniform width and which is convertible between at least two states by heating and has different electrical properties in different ones of the at least two states; forming the convertible structure along a sinusoidal path that increases a length of a path of an electric current propagating through the convertible structure between the first electrode and the second electrode relative to a shortest-distance path between the first and second electrodes.

* * * * *